United States Patent
Peichl et al.

(10) Patent No.: US 8,694,879 B1
(45) Date of Patent: Apr. 8, 2014

(54) EFFICIENT USE OF CRC WITH LIMITED DATA

(75) Inventors: Thomas Peichl, Woellstadt (DE); Walter Czarnocki, Hoffman Estates, IL (US); Kyle Joseph, Chicago, IL (US)

(73) Assignee: Continental Automotive Systems, Inc, Auburn Hills, MI (US)

( * ) Notice: Subject to any disclaimer, the term of this patent is extended or adjusted under 35 U.S.C. 154(b) by 209 days.

(21) Appl. No.: 13/232,252

(22) Filed: Sep. 14, 2011

Related U.S. Application Data

(60) Provisional application No. 61/382,650, filed on Sep. 14, 2010.

(51) Int. Cl.
*H03M 13/00* (2006.01)

(52) U.S. Cl.
USPC .......................... 714/807; 714/758; 714/781

(58) Field of Classification Search
USPC ....................................... 714/758, 781, 807
See application file for complete search history.

(56) References Cited

U.S. PATENT DOCUMENTS

| | | | | |
|---|---|---|---|---|
| 4,277,844 | A * | 7/1981 | Hancock et al. | 714/755 |
| 5,721,683 | A * | 2/1998 | Joyce et al. | 701/70 |
| 6,233,073 | B1 * | 5/2001 | Bowers et al. | 398/16 |
| 6,694,360 | B1 * | 2/2004 | Duguay et al. | 709/220 |
| 7,523,378 | B2 * | 4/2009 | Dammann et al. | 714/758 |
| 7,717,085 | B1 * | 5/2010 | Bauerle | 123/399 |
| 8,103,797 | B2 * | 1/2012 | Day | 709/248 |

OTHER PUBLICATIONS

SAE International, "Single Edge Nibble Transmission for Automotive Applications", Surface Vehicle Information Report, Issued Apr. 2007, Revised Jan. 2010, SAE International, J2716 Jan. 2010.

Martin Stigge et al., "Reversing Crc-Theory and Practice", Humboldt University Berlin Computer Science Department Systems Architecture Group, May, 2006, Humboldt University, SAR-PR-2006-05, Berlin, Germany.

* cited by examiner

*Primary Examiner* — Esaw Abraham

(57) ABSTRACT

An automotive sensor reads from memory previously stored back-calculated diagnostic-code values for which a fixed cyclic-redundancy-check ("CRC") value is valid and transmits the previously stored back-calculated diagnostic-code values read from memory each paired together with the fixed CRC value.

10 Claims, 2 Drawing Sheets

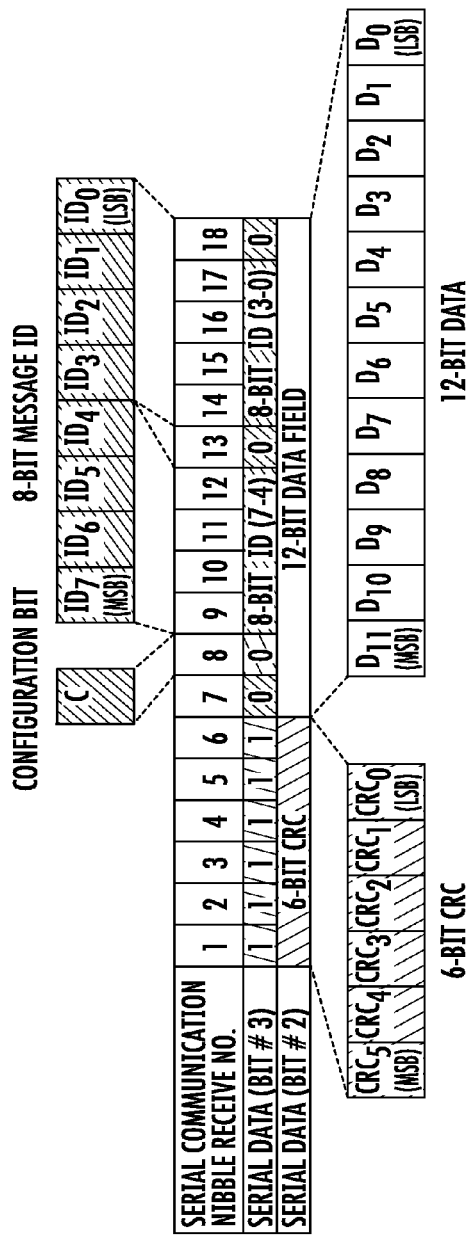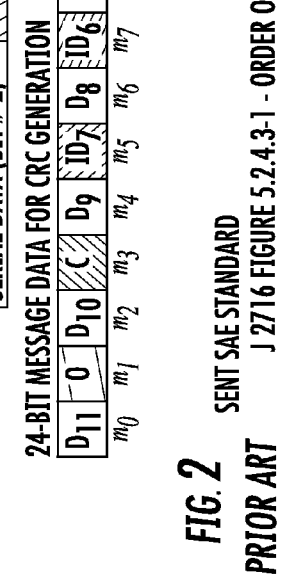
FIG. 1 PRIOR ART SENT SAE STANDARD J2716 FIGURE 5.2.4.2-2 - ENHANCED SERIAL MESSAGE FORMAT WIT 12-BIT DATA FIELD AND 8-BIT MESSAGE ID
FIG. 2 PRIOR ART SENT SAE STANDARD J2716 FIGURE 5.2.4.3-1 - ORDER OF THE MESSAGE BITS, 24-BIT MESSAGE USED FOR CRC GENERATION

EFFICIENT USE OF CRC WITH LIMITED DATA

CROSS-REFERENCE TO RELATED APPLICATIONS

This application is a non-provisional application of, and claims priority to the Sep. 14, 2010, filing date of U.S. Provisional Patent Application Ser. No. 61/382,650, which is incorporated herein by reference in its entirety.

BACKGROUND

FIG. 1 is FIG. 5.2.4.2-2 of the SENT SAE Standard J 2716 (rev. JAN2010) (referred to herein as the SENT Standard), which defines an Extended slow-serial message format consisting of six fixed "1" values, three fixed "0" values, a configuration bit, an 8- or 4-bit message ID, a 12- or 16-bit data field, and a 6-bit CRC.

SENT refers to Single Edge Nibble Transmission for Automotive Applications. The SENT Standard defines a level of standardization in the implementation of the digital pulse scheme for reporting sensor information via Single-Edge-Nibble-Transmission (SENT) encoding. Requirements stated in the SENT Standard provide a minimum standard level of performance to which compatible Electronic Control Units (ECUs) and media should be designed. This assures data communication among connected devices regardless of supplier.

SAE refers to the Society of Automotive Engineers.

A cyclic redundancy check (CRC), also referred to as a polynomial code checksum, is a non-secure hash function designed to detect accidental changes to raw binary data, and is commonly used in digital communication networks. A typical CRC-enabled device calculates a short, fixed-length binary sequence, known as the CRC code (sometimes referred to as a CRC), for each block of data and transmits the data block and the CRC code together. When a transmitted block is received, the receiving device repeats the CRC-code calculation; if the CRC code calculated by the receiving device does not match the received CRC code calculated by the transmitter, then the received data block contains a data error, and the receiving device may take corrective action, such as ignoring the received data block. Otherwise, the data block is assumed to be error free.

The 6-bit CRC of the SENT Standard is calculated from the data in columns 7 forward, as shown in FIG. 2, which is FIG. 5.2.4.3-1 from the SENT standard. Using this data and a six bit multiplier, the CRC-6 is calculated. The encoding for the CRC is defined by the generating polynomial:

$$G(x)=x^6+x^4+x^3+1$$

Improved techniques for calculating CRC codes would advance the art.

BRIEF SUMMARY

In accordance with embodiments of the invention, an automotive sensor reads from memory previously stored back-calculated diagnostic-code values for which a fixed cyclic-redundancy-check ("CRC") value is valid and transmits the previously stored back-calculated diagnostic-code values read from memory each paired together with the fixed CRC value.

In accordance with embodiments of the invention, an apparatus includes a memory having stored therein back-calculated diagnostic-code values for which a fixed cyclic-redundancy-check ("CRC") value is valid and an automotive sensor configured to transmit the back-calculated diagnostic-code values each paired together with the fixed-CRC value.

BRIEF DESCRIPTION OF THE DRAWINGS

FIG. 1 is FIG. 5.2.4.2-2 of the SENT SAE Standard J 2716 (rev. JAN2010) (referred to herein as the SENT Standard), which defines an Extended slow-serial message format.

FIG. 2 is FIG. 5.2.4.3-1 from the SENT standard.

DETAILED DESCRIPTION

Figure 3:
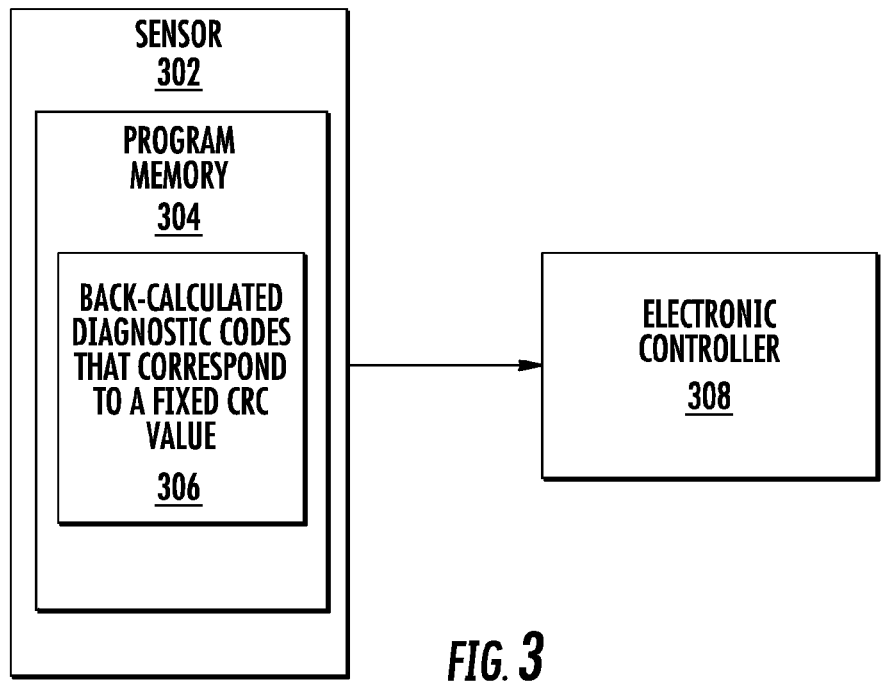
FIG. 3 is a schematic diagram of a system in accordance with embodiments of the invention.

The SENT Standard assumes that the 6-bit CRC will be calculated real-time by the transmitting module in a conventional manner. But this is a program memory-intensive calculation. Program memory constraints on the transmitter side may, in certain circumstances, make it impracticable to calculate a real-time CRC without increasing the need for resources, such as memory, processing power, and the like, which, but for the CRC calculation, would not be needed.

In accordance with embodiments of the invention, transmitter-side real-time calculation of CRC codes can be eliminated while transmitting diagnostic codes within a SENT Standard slow serial message. The SENT Standard serial message (with configuration bit "C"=1) contains a 12-bit data field and an 8-bit message ID. Based on this configuration, the SENT Standard defines multiple standard 8-bit message ID's in Table D.1-1 within Appendix D of the SENT Standard. These messages are defined to transmit fixed data over the operation time of a sensor, except message 01h ("h" refers herein to hexadecimal) "Diagnostic Error Codes" and the Supplementary data channel #1 & #2. An example sensor application in accordance with embodiments of the invention does not implement a Supplementary data channel #1 & #2, which leaves a variable data message type with message ID=01h "Diagnostic Error Codes." As the other messages are fixed, a pre-calculated CRC can be hard-coded with the corresponding data in the transmitter's memory thereby eliminating a need to calculate a CRC code in real time at the transmitter. For the "Diagnostic Error Codes," a fixed CRC code may be used in accordance with embodiments of the invention. The undefined "To be defined by OEM/Supplier" error code data fields 800-FFFh from Table D.5-1 within Appendix D of the SENT Standard may be used for storing various sensor error codes. By setting the CRC to a fixed value=1Bh, with the known configuration bit setting and "Diagnostic Error Codes" message ID=01h (based on the serial message contents in FIG. 1), and using the CRC-6 calculation, data fields within the 800-FFFh range, that match these settings, can be back calculated. Once such a list of data fields is compiled, these fields can be matched to individual diagnostic error codes, and the fixed CRC=1Bh may be hard-coded in the transmitter memory. This eliminates a need for calculating a CRC-6 code in real-time for a slow-serial message.

The basic diagnostic messages within a slow-serial message are defined in Appendix D of the SENT Standard for data fields 000-409h. The standard also defines diagnostic data fields 800-FFFh as "To be defined by OEM/Supplier." Within this area, a list of data fields can be back calculated, in accordance with embodiments of the invention, that will give a CRC=1Bh, knowing the diagnostic message ID=01h. In implementing specific diagnostic codes, if only the data fields within this list are used, the CRC can be fixed to 1Bh. The value of 1Bh is used because this is the CRC for the SENT-Standard-defined "No error" diagnostic data field=000h.

To perform a back-calculation in accordance with embodiments of the invention, a MATLAB® program may be written (based on the SENT standard CRC checksum MATLAB® calculation provided in section 5.2.4.3 of the SENT Standard, entitled Enhanced Serial Message Format CRC). MATLAB® is a high-level computer-programming language and interactive environment that facilitates performing computationally intensive tasks. Such a MATLAB® program may go through the CRC calculation for each data field 800-FFFh and may list the data fields having a CRC=1Bh. For example, the 32 following 12-bit data fields from 800h-FFFh have a CRC=1Bh: 83Eh, 867h, 88Ch, 8D5h, 903h, 95Ah, 9B1h, 9E8h, A1Dh, A44h, AAFh, AF6h, B20h, B79h, B92h, BCBh, C21h, C78h, C93h, CCAh, D1Ch, D45h, DAEh, DF7h, E02h, E5Bh, EB0h, EE9h, F3Fh, F66h, F8Dh, and FD4h.

Specific program diagnostic codes can be defined for any of these 12-bit data fields set forth above. When such program diagnostic codes are transmitted, the message may use a valid CRC=1Bh. A sensor may also use SENT Standard defined data field 000h for reporting "No error." In this way, embodiments of the invention advantageously allow a total of 33 possible messages that can be transmitted using a hard-coded CRC=1Bh.

FIG. 3 is a schematic diagram of a system in accordance with embodiments of the invention. Sensor 302 includes memory 304, which includes back-calculated diagnostic codes that correspond to a fixed CRC value 306. The sensor 302 transmits these back calculated diagnostic codes 306 along with the fixed CRC value to controller 308, as indicated by the arrow in FIG. 3 from the sensor 302 to the controller 308. Although the memory 304 containing the back-calculated diagnostic codes 306 is shown as being contained within the sensor 302 in FIG. 3, those skilled in the art will appreciate that the memory may be external to the sensor.

Sensor 302 may be any type of automotive sensor, including, but not limited to various types of: pressure sensors, temperature sensors, speed sensors, and the like.

Figure 4:
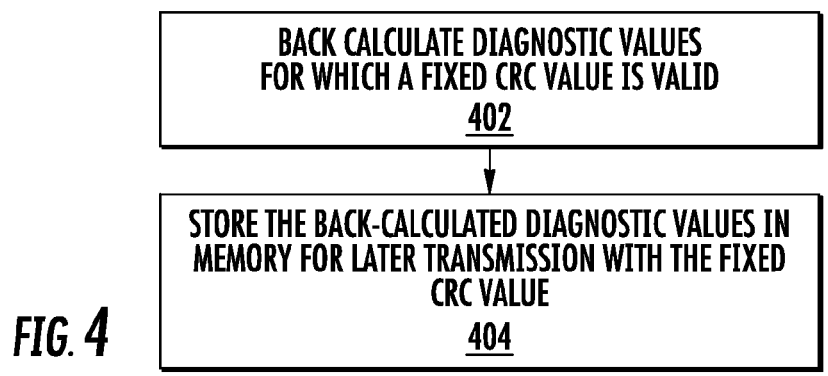
FIG. 4 is a flow chart showing steps for back calculating and storing in memory diagnostic values for which a fixed CRC value is valid in accordance with embodiments of the invention.

FIG. 4 is a flow chart showing steps for back calculating and storing in memory diagnostic values for which a fixed CRC value is valid in accordance with embodiments of the invention. Diagnostic values for which a fixed CRC value is valid are back calculated, as shown at 402. The back-calculated values are then stored in memory, such as memory 304, for later transmission with the fixed CRC value, as shown at 404.

Figure 5:
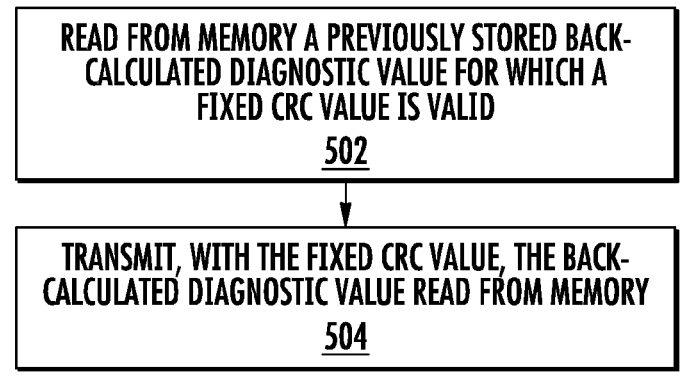
FIG. 5 is a flow chart showing steps for reading from memory and transmitting a previously stored back-calculated diagnostic value in accordance with embodiments of the invention.

FIG. 5 is a flow chart showing steps for reading from memory and transmitting a previously stored back-calculated diagnostic value in accordance with embodiments of the invention. A previously stored back-calculated diagnostic value for which a fixed CRC value is valid is read from memory, such as memory 304, as shown at 502. The back-calculated diagnostic value read from memory is then transmitted with the fixed CRC value, as shown at 504.

When using the SENT Standard extended serial message with 8-bit message ID, the need for a real-time CRC-6 calculation can be eliminated in accordance with embodiments of the invention. This allows transmitters to reduce the resource demands associated with implementing the SENT Standard.

The foregoing discussion has illustrated various structural and functional principles of embodiments of the invention, which are subject to variations without departing from such principles.

The invention claimed is:

1. A method performed by an automotive sensor, the method comprising:
reading from memory previously stored back-calculated diagnostic-code values for which a fixed cyclic-redundancy-check ("CRC") value is valid;
transmitting the previously stored back-calculated diagnostic-code values read from memory each paired together with the fixed CRC value; and wherein the previously stored back-calculated diagnostic-code values for which the fixed-CRC value is valid include values within a range of 800-FFF hexadecimal, the fixed-CRC value is 1B hexadecimal, and a diagnostic-error-codes-message identifier is 01 hexadecimal.

2. The method of claim 1, wherein the fixed-CRC value corresponds to a diagnostic-code value that indicates a no-error condition.

3. The method of claim 1, wherein the previously stored back-calculated diagnostic-code values for which the fixed-CRC value is valid are selected from the group of hexadecimal values consisting of: 83E, 867, 88C, 8D5, 903, 95A, 9B1, 9E8, AM, A44, AAF, AF6, B20, B79, B92, BCB, C21, C78, C93, CCA, D1C, D45, DAE, DF7, E02, ESB, EB0, EE9, F3F, F66, F8D, and FD4.

4. The method of claim 3, using a Single-Edge-Nibble-Transmission-for-Automotive-Applications ("SENT")-Standard-defined diagnostic-code value of 000 hexadecimal to indicate a no-error condition.

5. Apparatus comprising:
a memory having stored therein back-calculated diagnostic-code values for which a fixed cyclic-redundancy-check ("CRC") value is valid;
an automotive sensor configured to transmit the back-calculated diagnostic-code values each paired together with the fixed-CRC value; and the apparatus of claim wherein the previously stored back-calculated diagnostic-code values for which the fixed-CRC value is valid include values within a range of 800-FFF hexadecimal the fixed-CRC value is 1LB hexadecimal, and a diagnostic-error-codes-message identifier is 01 hexadecimal.

6. The apparatus of claim 5, wherein the fixed-CRC value corresponds to a diagnostic-code value that indicates a no-error condition.

7. The apparatus of claim 5, wherein the previously stored back-calculated diagnostic-code values for which the fixed-CRC value is valid are selected from the group of hexadecimal values consisting of: 83E, 867, 88C, 8D5, 903, 95A, 9B1, 9E8, AM, A44, AAF, AF6, B20, B79, B92, BCB, C21, C78, C93, CCA, D1C, D45, DAE, DF7, E02, ESB, EB0, EE9, F3F, F66, F8D, and FD4.

8. The apparatus of claim 7, wherein a Single-Edge-Nibble-Transmission-for-Automotive-Applications ("SENT")-Standard-defined-diagnostic-code value of 000 hexadecimal is used to indicate a no-error condition.

9. The apparatus of claim 5, wherein the memory containing the back-calculated diagnostic-code values is contained within the sensor.

10. The apparatus of claim 5, wherein the memory containing the back-calculated diagnostic-code values is external to the sensor.

\* \* \* \* \*